(12) United States Patent
Irie et al.

(10) Patent No.: US 8,278,014 B2
(45) Date of Patent: *Oct. 2, 2012

(54) PHOTOMASK AND PATTERN FORMATION METHOD USING THE SAME

(75) Inventors: Shigeo Irie, Toyama (JP); Akio Misaka, Osaka (JP); Yuji Nonami, Kyoto (JP); Tetsuya Nakamura, Toyama (JP); Chika Harada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/178,256

(22) Filed: Jul. 7, 2011

(65) Prior Publication Data

US 2011/0262849 A1 Oct. 27, 2011

Related U.S. Application Data

(63) Continuation of application No. 12/200,478, filed on Aug. 28, 2008, now Pat. No. 7,998,641.

(30) Foreign Application Priority Data

Sep. 3, 2007 (JP) .................................. 2007-227640

(51) Int. Cl.
G03F 1/00 (2006.01)
G03F 9/00 (2006.01)
G03F 7/00 (2006.01)
(52) U.S. Cl. ................. 430/5; 430/22; 430/311
(58) Field of Classification Search ................ 430/5, 22, 430/311
See application file for complete search history.

(56) References Cited

U.S. PATENT DOCUMENTS

| | | | |
|---|---|---|---|
| 5,723,236 | A | 3/1998 | Inoue et al. |
| 5,725,969 | A | 3/1998 | Lee |
| 5,888,674 | A | 3/1999 | Yang et al. |
| 6,207,333 | B1 | 3/2001 | Adair et al. |
| 6,255,023 | B1 | 7/2001 | Huang et al. |
| 6,376,139 | B1 | 4/2002 | Fujisawa et al. |
| 6,413,684 | B1 | 7/2002 | Stanton |
| 6,703,168 | B1 | 3/2004 | Misaka |
| 7,060,395 | B2 | 6/2006 | Misaka |
| 7,060,398 | B2 | 6/2006 | Misaka |

(Continued)

FOREIGN PATENT DOCUMENTS

JP 8-106151 4/1996

(Continued)

OTHER PUBLICATIONS

United States Notice of Allowance issued in U.S. Appl. No. 12/200,478, mailed Apr. 7, 2011.

(Continued)

*Primary Examiner* — Mark F Huff
*Assistant Examiner* — Jonathan Jelsma
(74) *Attorney, Agent, or Firm* — McDermott Will & Emery LLP

(57) ABSTRACT

A photomask includes a transparent substrate having a transparent property against exposing light, a semi-light-shielding portion formed on the transparent substrate, a first opening formed in the semi-light-shielding portion and having a first dimension and a second opening formed in the semi-light-shielding portion and having a second dimension lager than the first dimension. A phase-shifting portion which transmits the exposing light in an opposite phase with respect to the first opening is formed on the transparent substrate around the first opening. A light-shielding portion is formed on the transparent substrate around the second opening.

13 Claims, 11 Drawing Sheets

U.S. PATENT DOCUMENTS

| | | |
|---|---|---|
| 7,147,975 B2 | 12/2006 | Misaka |
| 2002/0197544 A1 | 12/2002 | Iwasaki |
| 2003/0064300 A1 | 4/2003 | Watanabe |
| 2003/0203290 A1 | 10/2003 | Misaka |
| 2005/0069788 A1 | 3/2005 | Tanaka et al. |
| 2005/0277034 A1 | 12/2005 | Mitsui |
| 2006/0093963 A1 | 5/2006 | Terahara |
| 2006/0121364 A1 | 6/2006 | Omura |
| 2007/0003879 A1 | 1/2007 | Chang et al. |
| 2008/0038675 A1 | 2/2008 | Nagasaka |
| 2009/0061328 A1 | 3/2009 | Nonami et al. |
| 2009/0061330 A1 | 3/2009 | Irie et al. |

FOREIGN PATENT DOCUMENTS

| | | |
|---|---|---|
| JP | 9-281690 | 10/1997 |
| JP | 10-010700 | 1/1998 |
| JP | 11-15130 | 1/1999 |
| JP | 2000-19710 | 1/2000 |
| JP | 2001-296647 | 10/2001 |
| JP | 2003-233164 | 8/2003 |
| JP | 2003-322949 | 11/2003 |
| JP | 2005-25230 | 1/2005 |
| JP | 2006-079219 | 3/2006 |

OTHER PUBLICATIONS

United States Office Action issued in U.S. Appl. No. 12/181,650, mailed Mar. 16, 2011.

United States Notice of Allowance issued in U.S. Appl. No. 12/204,252, mailed Nov. 17, 2010.

United States Office Action issued in U.S. Appl. No. 12/181,650, mailed Nov. 3, 2010.

United States Office Action, issued in U.S. Appl. No. 12/181,650, mailed Jun. 9, 2010.

United States Office Action, issued in U.S. Appl. No. 12/204,252, mailed Jun. 23, 2010.

PHOTOMASK AND PATTERN FORMATION METHOD USING THE SAME

This application is a Continuation of U.S. patent application Ser. No. 12/200,478, filed on Aug. 28, 2008, now U.S. Pat. No. 7,998,641, claiming priority of Japanese Patent Application No. 2007-227640, filed on Sep. 3, 2007, the entire contents of each of which are hereby incorporated by reference.

BACKGROUND OF THE INVENTION

1. Field of the Invention

The present invention relates to a photomask used for forming a fine pattern in fabrication of a semiconductor integrated circuit device and a pattern formation method using the photomask.

2. Description of Related Art

Recently, there are increasing demands for refinement of a circuit pattern due to a high degree of integration of a large scale integrated circuit device (hereinafter referred to as an LSI) realized by using a semiconductor. As a result, great importance is placed on refinement of a wiring pattern forming the circuit or a contact hole pattern for connecting multiple wiring layers with insulating layers interposed therebetween (hereinafter referred to as a contact pattern). For the formation of the contact pattern, a technique of simultaneously forming isolated patterns and densely arranged patterns has been required. For achieving large depth of focus in the formation of the densely arranged contact patterns, for example, it is effective to perform oblique-incidence exposure (off-axis exposure) just like for the formation of the densely arranged contact patterns. Specifically, the oblique-incidence exposure is essential for the formation of the dense contact patterns. However, the oblique-incidence exposure considerably deteriorates contrast and the depth of focus of the isolated contact patterns. The deterioration of the contrast and the depth of focus occurs more significantly when a half-tone phase-shifting mask, which is widely used for improvement in resolution, is used. On the other hand, when a light source of low coherence suitable for the formation of isolated fine contact patterns is used, the formation of the dense patterns becomes difficult.

As described above, the optimum lighting condition for the isolated fine contact patterns is contradictory to the optimum lighting condition for the densely arranged contact patterns. Therefore, in order to form the densely arranged fine patterns and the isolated patterns at the same time, tradeoff is made on the effect of a vertical incident light component and the effect of an oblique incident light component emitted from a light source. As a result, a light source having a medium degree of coherence (about 0.5 to 0.6) is used. In this case, however, the effects of the vertical incident light component and the oblique incident light components cancel each other. This makes it difficult to achieve the simultaneous refinement of the dense patterns and the isolated patterns to enhance the degree of integration of the semiconductor device. One of effective solutions to this problem is use of an enhancer mask.

Hereinafter, the principle of pattern formation using the enhancer mask is explained with reference to FIGS. 13A to 13D.

FIGS. 13A and 13B show an exemplified plane structure and an exemplified cross-sectional structure of the enhancer mask. As shown in FIGS. 13A and 13B, the enhancer mask includes a transparent substrate 1 having a transparent property against exposing light, on which provided are a semi-light-shielding portion 2 having a predetermined transmittance to the exposing light, an opening 3 surrounded by the semi-light-shielding portion 2 and having a transparent property against the exposing light and a phase-shifting portion 4 surrounded by the semi-light-shielding portion 2 and located on the periphery of the opening 3. The semi-light-shielding portion 2 and the opening 3 transmit the exposing light in an identical phase. The phase-shifting portion 4 transmits the exposing light in an opposite phase with respect to the semi-light-shielding portion 2 and the opening 3, but is not transferred on a wafer by exposure. The phase-shifting portion 4 is provided by, for example, forming an opening in the semi-light-shielding portion 2 and digging an exposed part of the transparent substrate 1 by a predetermined depth.

FIG. 13C is a diagram for showing a light intensity profile obtained by using the enhancer mask of FIGS. 13A and 13B, and FIG. 13D is a schematic diagram for showing the plane structure of a pattern to be transferred onto a wafer when the opening 3 of FIGS. 13A and 13B is a hole pattern. As shown in FIG. 13C, in the photomask shown in FIGS. 13A and 13B, light passing through the phase-shifting portion 4 on the periphery of the opening 3 cancels a portion of lights passing through the opening 3 and the semi-light-shielding portion 2, respectively. Therefore, if the intensity of light passing through the phase-shifting portion 4 is adjusted so that the light passing around the opening 3 is canceled, a dark portion in which the light intensity corresponding to the light passing around the opening 3 is reduced to approximately 0 is formed in the light intensity distribution. The light passing through the phase-shifting portion 4 pronouncedly cancels the light passing around the opening 3, while it slightly cancels light passing near the center of the opening 3. As a result, the light intensity profile of the light passing through the enhancer mask becomes steep in part thereof from the center of the opening 3 to the periphery of the opening 3. Thus, the light passing through the enhancer mask shows a sharp light intensity profile. Therefore, as shown in FIG. 13D, a high contrast image is formed.

As described above, with the provision of the phase-shifting portion 4 along the outline of the opening 3 on the mask with the low-transmittance semi-light-shielding portion 2 on the transparent substrate 1, a considerably dark portion corresponding to the outline of the opening 3 is formed in a light intensity image formed by using the mask (enhancer mask). This makes it possible to provide light intensity distribution with enhanced contrast between the light intensity of the opening 3 and the light intensity around the opening 3. Thus, the enhancer mask is highly effective for the simultaneous formation of the fine isolated contact pattern (e.g., each side of the opening 3 is smaller than $(0.5 \times \lambda/NA)$ ($\lambda$: a wavelength of the exposing light, NA: numerical aperture)) and the densely arranged contact patterns.

The enhancer mask is actually effective for the above-described fine pattern formation. However, use of the enhancer mask brings about the following problem for the formation of relatively large contact patterns (e.g., each side of the opening is larger than $(0.5 \times \lambda/NA)$ ($\lambda$: a wavelength of the exposing light, NA: numerical aperture)) typified by accessory patterns, such as a reticle position monitor pattern for aligning a reticle with an aligner, an overlay monitor pattern for overlaying an upper layer on a lower layer and other patterns.

FIGS. 14A and 14B show an exemplified plane structure and an exemplified cross-sectional structure of the enhancer mask. In FIGS. 14A and 14B, like reference numerals are used to refer to like elements of the photomask of FIGS. 13A and 13B so as to avoid repetition of the description. The enhancer mask shown in FIGS. 14A and 14B has a larger opening 3 as compared with that of the half-tone phase-shifting mask shown in FIGS. 13A and 13B.

FIG. 14C is a diagram of a light intensity profile obtained in using the enhancer mask of FIGS. 14A and 14B. FIG. 14D is a schematic plan view of a pattern transferred onto a wafer when the opening 3 of FIGS. 14A and 14B is a hole pattern. In this enhancer mask, just like in the half-tone phase-shifting mask, an unwanted side lobe with the local maximum value of the light intensity is caused around the opening 3 due to the influence of diffraction of the light caused at the edge of the opening 3 as shown in FIGS. 13C and 14C. The local maximum value of the light intensity of the side lobe is in proportion to the dimension of the opening 3. In particular, when the local maximum value of the light intensity of the side lobe exceeds an exposure threshold value (i.e., the minimum value of the light intensity for sensitizing a resist to be exposed) as shown in FIG. 14C, an unwanted pattern (a side lobe pattern) is disadvantageously transferred onto the periphery of a portion of the wafer corresponding to the opening 3 as shown in FIG. 14D.

As a method for preventing the occurrence of a side lobe, mask bias (modification of a mask pattern caused by proximity correction or the like) is increased to reduce the exposure amount. In this method, however, the contrast is disadvantageously lowered.

In order to overcome this problem, Patent Document 1 discloses, although which is directed to a half-tone phase-shifting mask, a method of preventing the occurrence of a side lobe in a large opening such as an accessory pattern by forming an accessory pattern or other patterns on a light-shielding region. FIG. 15 is a plan view illustrating a conventional photomask disclosed by Patent Document 1. As shown in FIG. 15, a halftone portion 2 is provided in the middle of a transparent substrate (not shown) and a light-shielding portion 5 is provided along the edge of the transparent substrate. First openings 3A each having a dimension of not more than $0.5 \times \lambda/NA$ are formed in the halftone portion 2 and second openings 3B each having a dimension larger than $0.5 \times \lambda/NA$ are formed in the light-shielding portion 5.

[Patent Document 1] Publication of Japanese Patent Application No. 9-281690

SUMMARY OF THE INVENTION

As described above, the enhancer mask is highly effective for the simultaneous formation of the isolated contact patterns each corresponding to openings with each side being smaller than ($0.5 \times \lambda/NA$) and the densely arranged contact patterns. However, even if the enhancer mask is used, the side lobe is caused around the accessory pattern or the like which is an opening with each side being larger than ($0.5 \times \lambda/NA$), just like the case where the half-tone phase-shifting mask is used. When the accessory pattern is formed in the light-shielding region according to the method of Patent Document 1, the side lobe is less likely to occur.

In the case where the method disclosed in Patent Document 1 is used in combination with the enhancer mask, however, there arises a problem that a resist defect is caused around a portion on a wafer corresponding to the large opening such as the accessory pattern. This problem is serious in employing ArF exposure process and particularly ArF immersion exposure process.

An object of the invention simultaneously preventing the occurrence of a side lobe and the occurrence of a resist defect even when an enhancer mask capable of simultaneously forming a fine isolated contact pattern and densely arranged contact patterns is provided with an accessory pattern or the like formed of a large opening.

In order to achieve the object, the present inventors have studied the cause of a resist defect occurring around a portion on a wafer corresponding to the large opening as the accessory pattern in using the conventional method disclosed in Patent Document 1 with the enhancer mask, resulting finding the following:

In accordance with recent refinement, use of a chemically amplified resist is essential. In pattern formation using a chemically amplified resist, an acid having a catalytic function is produced through a photochemical reaction caused in exposure, and the acid is used as a catalyst in a reaction of functional groups included in a resist polymer in annealing process performed after the exposure, so as to form a pattern by utilizing property change caused in the reaction. In this case, in positive resist process, a pattern is formed by dissolving, in a developer, merely a portion irradiated with exposing light for reacting the functional groups.

A chemically amplified resist is known to have a characteristic of very high reactivity. Particularly, an ArF resist used in the ArF exposure process has high reactivity, and since a surface portion of the resist is easily reacted with any ambient substance, an insoluble layer insoluble in the developer is frequently formed in the vicinity of the surface of the resist.

Furthermore, in pattern formation of an LSI of a 45 nm or finer rule, immersion exposure has been employed for improving resolution capability and preventing degradation of a DOF (depth of focus) derived from increase of the NA. In the immersion exposure, the exposure is performed with a liquid having a higher refractive index than the air (hereinafter referred to as the immersion liquid) present between a wafer and a projector lens of an aligner. In the immersion exposure, in order to prevent resist characteristic degradation derived from direct contact between a resist and the immersion liquid, the direct contact between the resist and the immersion liquid is avoided by coating the resist surface with a resist protection film designated as a top coat. Although the direct contact between the resist and the immersion liquid can be avoided by using the top coat, since the resist is in direct contact with the top coat, a chemical reaction is caused on the contact face therebetween, so that an insoluble layer insoluble in the developer can be more easily formed.

When a region of the resist where the insoluble layer is formed is irradiated with light, the resist surface is dissolved during development and adhesion between the insoluble layer and the resist is lowered, and hence, the insoluble layer can be easily removed out of the wafer through rinsing process performed after the development.

On the other hand, in a completely unexposed region not irradiated with the light at all (namely, a region with light intensity of zero), the adhesion between the insoluble layer and the resist is not lowered, and hence, the insoluble layer cannot be removed out of the wafer through the rinsing process. Therefore, the insoluble layer scatters around the completely unexposed region, resulting in causing a resist defect on the wafer.

In the case where the method disclosed in Patent Document 1 is used in combination with the enhancer mask as described above, a large opening as the accessory pattern is formed in the light-shielding region. Therefore, a large completely unexposed region is formed due to the light-shielding region which occupies most of the portion around the large opening. When the ArF exposure process, and more particularly the ArF immersion exposure process in which the chemically amplified resist and the top coat are used in combination, is employed, an insoluble layer insoluble in the developer is easily formed. As a result, there arises a problem that a resist defect derived from the insoluble layer is caused around a portion of the wafer corresponding to the large opening as the accessory pattern. That is, even if the method disclosed in Patent Document 1 is applied to the enhancer mask, the occurrence of a side lobe and the occurrence of a resist defect cannot be prevented at the same time.

The present invention was devised on the basis of the aforementioned finding, and the photomask of this invention includes: a transparent substrate having a transparent property against exposing light; a semi-light-shielding portion formed on the transparent substrate; a first opening formed in the semi-light-shielding portion and having a first dimension; a second opening formed in the semi-light-shielding portion and having a second dimension lager than the first dimension; a phase-shifting portion formed on the transparent substrate around the first opening and transmitting the exposing light in an opposite phase with respect to the first opening and a light-shielding portion formed on the transparent substrate around the second opening.

It is noted that a dimension of an opening herein means a length of one side when the opening has, for example, a square plane shape, and means a diameter when the opening has, for example, a circular plane shape, and the plane shape of the opening is not particularly specified.

Furthermore, to have a transparent property against exposing light herein means to have transmittance sufficiently high for sensitizing a resist, and to have a light-shielding property against exposing light herein means to have transmittance sufficiently low for not sensitizing a resist. Also, an identical phase means that there is a phase difference not less than $(-30+360 \times n)$ degrees and not more than $(30+360 \times n)$ degrees (wherein n is an integer), and an opposite phase means that there is a phase difference not less than $(150+360 \times n)$ degrees and not more than $(210+360 \times n)$ degrees.

FIG. 1B is a plan view of a specific example of a photomask (an enhancer mask) according to the present invention, FIG. 1C is a cross-sectional view taken on line A-A' of FIG. 1B and FIG. 1D is a cross-sectional view taken on line B-B' of FIG. 1B. As shown in FIGS. 1B through 1D, in a semi-light-shielding portion 12 which is formed on a transparent substrate 11 and allows exposing light to partially pass through, first openings 13A each having a first dimension not more than, for example, $(0.5 \times \lambda/NA) \times M$ (wherein $\lambda$ is a wavelength of the exposing light, NA is numerical aperture of a reduction projection optical system of an aligner and M is a reduction ratio of the reduction projection optical system) and second openings 13B each having a second dimension larger than, for example, $(0.5 \times \lambda/NA) \times M$, are formed. Further, a phase-shifting portion 14 is faulted on the transparent substrate 11 around each of the first openings 13A.

In this case, as a characteristic of the photomask of this invention shown in FIGS. 1B through 1D, a light-shielding portion 15 is provided on the transparent substrate 11 around each of the second openings 13B. The second openings 13B are accessory patterns, such as a reticle position monitor pattern 18 and an overlay monitor pattern 19.

Specifically, when a dimension of the light-shielding portion 15 (namely, a Cr width $W_{Cr}$ shown in FIG. 1D) provided around each second opening 13B is set to be sufficiently large for preventing the occurrence of a side lobe and to be sufficiently small for preventing formation of a completely unexposed region, i.e., a cause of a resist defect, in the photomask of this invention, the occurrence of a side lobe is prevented as well as the occurrence of a defect derived from an unexposed region can be prevented even when the enhancer mask is provided with a large opening such as an accessory pattern.

In the photomask of this invention, the Cr width $W_{Cr}$ is preferably not less than $(0.12 \times \lambda/NA) \times M$ and not more than $(1.74 \times \lambda/NA) \times M$. Thus, the occurrence of a side lobe can be definitely prevented and the occurrence of a defect derived from an unexposed region can be definitely prevented.

The pattern formation method of this invention in which the photomask of this invention is used includes the steps of: (a) forming a resist film on a substrate; (b) irradiating the resist film with the exposing light through the photomask; and (c) patterning the resist film by developing the resist film having been irradiated with the exposing light.

In the pattern formation method of this invention, a pattern can be formed while simultaneously suppressing the occurrence of a side lobe and the occurrence of a defect derived from an unexposed region.

As described so far, according to the present invention, even when an enhancer mask which capable of simultaneously forming a fine isolated contact pattern and densely arranged contact patterns is provided with a large opening such as an accessory pattern or other patterns, and particularly when the enhancer mask is used with immersion exposure process or the like in which a chemically amplified resist and a top coat are used in combination, the occurrence of a side lobe and the occurrence of a defect can be simultaneously prevented, so that a fine LSI can be fabricated.

Specifically, the present invention relates to a photomask used in forming a fine pattern in fabrication of a semiconductor integrated circuit device and a pattern formation method using the photomask, and is very useful for pattern formation or the like employing the ArF exposure process or the ArF immersion exposure process.

DETAILED DESCRIPTION OF THE INVENTION

Prerequisites

Prerequisites for describing a preferred embodiment of the invention will be first described.

Since a photomask is generally used in a reduction projection type aligner, it is necessary to consider a reduction ratio in arguing a pattern dimension on the mask. However, in order to avoid confusion, in the description of the embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, in the case where a resist pattern with a width of 70 nm is formed by using a mask pattern with a width of M×70 nm in a 1/M reduction projection system, the width of the mask pattern and the width of the resist pattern are both described as 70 nm.

Also, in the embodiment of the invention, M and NA respectively indicate a reduction ratio and numerical aperture of a reduction projection optical system of an aligner and λ indicates the wavelength of exposing light unless otherwise mentioned.

Moreover, pattern formation is described on the assumption that positive resist process for forming a resist pattern correspondingly to an unexposed region of a resist is employed. In the case where negative resist process is employed instead of the positive resist process, since an unexposed region of a resist is removed in the negative resist process, a resist pattern of the positive resist process is replaced with a space pattern.

Moreover, it is assumed that a photomask described in the embodiment of the invention is a transmission mask. In the case where the present photomask is applied to a reflection mask instead of a transmission mask, since a transparent region and a light-shielding region of a transmission mask respectively correspond to a reflection region and a non-reflection region, the transmission phenomenon of a transmission mask is replaced with the reflection phenomenon. Specifically, an opening or a transparent region of a transmission mask is replaced with a reflection portion or a reflection region, and a light-shielding portion is replaced with a non-reflection portion. Furthermore, a region partially transmitting light in a transmission mask is replaced with a region partially reflecting light in a reflection mask, and transmittance is replaced with reflectance.

Embodiment

A photomask according to an embodiment of the invention will now be described with reference to the accompanying drawings.

Figure 1A:
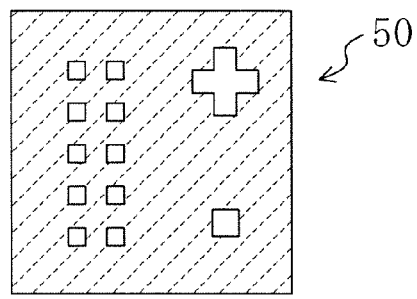
FIG. 1A is a diagram of an exemplified pattern to be formed by using a photomask according to an embodiment of the invention.

FIG. 1A shows an example of a pattern to be formed by using the photomask according to the embodiment of the invention. Also, FIG. 1B is a plan view of an example of the photomask of this embodiment, and more specifically, an example of an enhancer mask used for forming a desired pattern 50 shown in FIG. 1A, FIG. 1C is a cross-sectional view taken on line A-A' of FIG. 1B and FIG. 1D is a cross-sectional view taken on line B-B' of FIG. 1B.

Figure 1B:
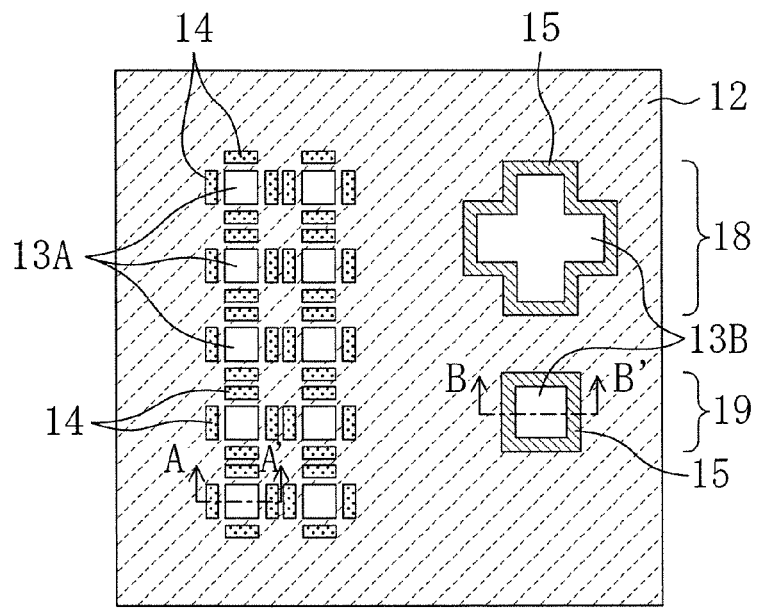
FIG. 1B is a plan view of an exemplified photomask according to the embodiment of the invention.
Figure 1C:
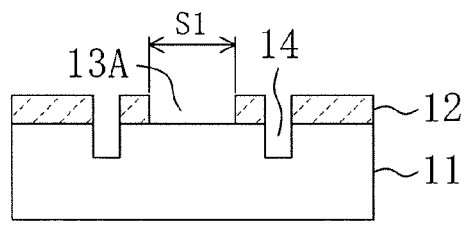
FIG. 1C is a cross-sectional view taken on line A-A' of FIG. 1B
Figure 1D:
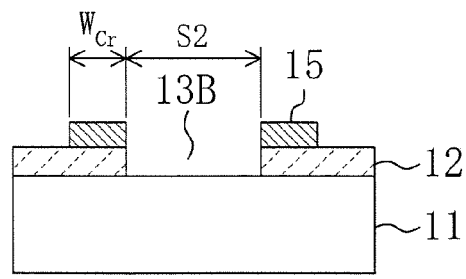
FIG. 1D is a cross-sectional view taken on line B-B' of FIG. 1B.

As shown in FIGS. 1B through 1D, in a semi-light-shielding portion 12 formed on the transparent substrate 11 and partially transmits exposing light, first openings 13A each having a first dimension S1 not more than, for example, $(0.5 \times \lambda/NA) \times M$ and second openings 13B each having a second dimension S2 larger than, for example, $(0.5 \times \lambda/NA) \times M$ are formed. A phase-shifting portion 14 is formed on the transparent substrate 11 around each of the first openings 13A. The semi-light-shielding portion 12 transmits exposing light in the identical phase with respect to the first opening 13A and the second opening 13B. The phase-shifting portion 14 transmits exposing light in an opposite phase with respect to the semi-light shielding portion 12, the first opening 13A and the second opening 13B, but is not transferred by exposure. The phase-shifting portion 14 is formed by, for example, providing an opening in the semi-light-shielding portion 12 and digging an exposed part of the transparent substrate 11 by a predetermined depth.

When it is assumed, for example, that the exposing wavelength λ is 193 nm, the numerical aperture NA is 1.2 and the reduction ratio M is 4, each first opening 13A is formed so as to have a hole size necessary for an LSI of a 45 nm rule, and specifically, so as to be in a square shape with each side of 70 nm (corresponding to an actual dimension on the mask of 280 nm obtained by multiplying 70 nm by 4). On the other hand, each second opening 13B is an accessory pattern such as a reticle position monitor pattern (namely, a pattern for aligning a reticle against the aligner) or an overlay monitor pattern (namely, a pattern for aligning an upper layer against a lower layer). The dimension and the shape of such an accessory pattern naturally depend upon the kind of aligner. In this embodiment, a reticle position monitor pattern 18 having a cross-shaped mark with a side of, for example, 4 μm (having a total width of 12 μm (corresponding to an actual dimension on the mask of 48 μm obtained by multiplying 12 μm by 4)) and an overlay monitor pattern 19 having a side of, for example, 10 μm (corresponding to an actual dimension on the mask of 40 μm obtained by multiplying 10 μm by 4) are formed as the second openings 13B.

As a characteristic of the photomask of this embodiment, light-shielding portions 15 are provided on the transparent substrate 11 merely around the second openings 13B as shown in the cross-sectional view of FIG. 1C taken on line A-A' of FIG. 1B crossing the first opening 13A and in the cross-sectional view of FIG. 1D taken on line B-B' of FIG. 1B crossing the second opening 13B.

In the photomask of this embodiment, a dimension of the light-shielding portion 15 (namely, a Cr width $W_{Cr}$ shown in FIG. 1D) provided around each second opening 13B is set to be sufficiently large for preventing the occurrence of a side lobe and to be sufficiently small for preventing the formation of a completely unexposed region, and thus, the occurrence of a side lobe and the occurrence of a defect derived from an unexposed region can be both prevented.

In the case where, for example, a contact hole pattern having the first dimension not more than $0.5 \times \lambda/NA$ is formed as each first opening 13A, the Cr width $W_{Cr}$ set for each second opening 13B for simultaneously preventing the occurrence of a side lobe and the occurrence of a resist defect derived from an unexposed region is obtained through simulation as follows: In the simulation, the semi-light-shielding portion 12 is set to have transmittance of, for example, 5 to 10% against the exposing light and the phase of light passed through the semi-light-shielding portion 12 is identical to the phase of light passed through each of the opening (the phase in this case is 0 degree). Also, the light-shielding portion 15 is set to have transmittance of 0% against the exposing light, namely, the light-shielding portion 15 is set to completely shield the exposing light. Further, the phase of light passed through the phase-shifting portion 14 around each of the first openings 13A is opposite to the phase of light passed through each of the openings (the phase in this case is 180 degrees).

A side lobe is caused when the energy of light passing through a semi-light-shielding portion is added to a secondary peak of light intensity derived from light diffraction caused at the edge of an opening, and when the local maximum value of the light intensity of a side lobe exceeds an exposure threshold value, a portion of a resist on a wafer is sensitized and hence an unwanted pattern is disadvantageously transferred. Accordingly, in order to prevent the occurrence of a side lobe, the position of a secondary peak on a photomask is shielded by a light-shielding portion. However, when the width of the light-shielding portion (namely, the Cr width $W_{Cr}$) is too small, the occurrence of a side lobe cannot be prevented and hence, the Cr width $W_{Cr}$ needs to be large to some extent.

Figure 2:
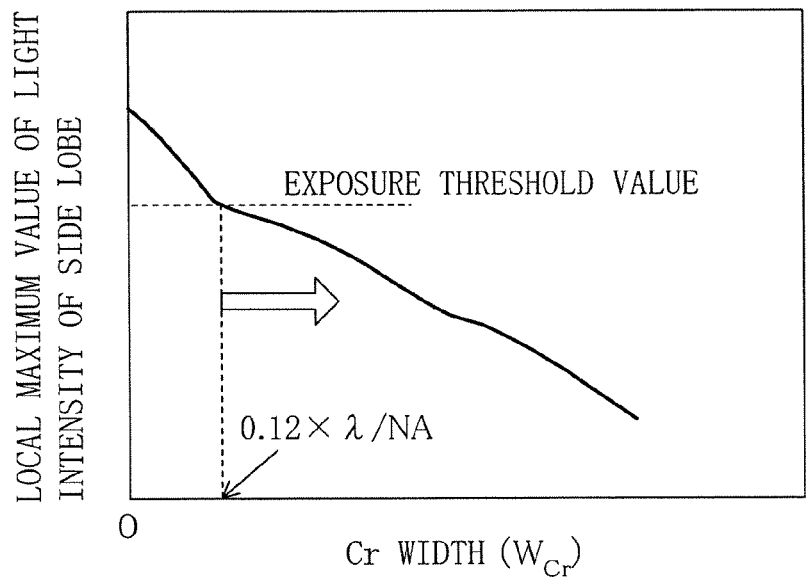
FIG. 2 is a diagram for showing the relationship, obtained by the present inventors through simulation, between the local maximum value of light intensity of a side lobe and the width of a light-shielding portion in the photomask of the embodiment of the invention.

FIG. 2 shows the relationship between the local maximum value of the light intensity of a side lobe and the Cr width $W_{Cr}$ obtained as a result of the simulation performed by the present inventors. As shown in FIG. 2, when the Cr width $W_{Cr}$ is increased, the amount of exposing light passing through the semi-light-shielding portion is reduced, and hence, the local maximum value of the light intensity of a side lobe is reduced, and when the Cr width $W_{Cr}$ is not less than $0.12 \times \lambda/NA$, the light intensity of a side lobe is smaller than the exposure threshold value. In other words, when the Cr width $W_{Cr}$ is not less than $0.12 \times \lambda/NA$, the occurrence of a side lobe can be prevented.

On the other hand, as described in "Summary of the Invention", when the Cr width $W_{Cr}$ is increased, namely, when a light-shielding region made of a light-shielding portion is increased, a completely unexposed region is formed. As a result, a defect derived from an insoluble layer in exposure process occurs. Specifically, when the Cr width $W_{Cr}$ is small, light diffracted at the edge of an opening comes around to the back of a light-shielding portion and hence a completely unexposed region is not formed. On the other hand, when a light-shielding portion has a Cr width $W_{Cr}$ sufficiently large for avoiding influence of the light diffracted at the edge of an opening, a completely unexposed region is formed.

Figure 3:
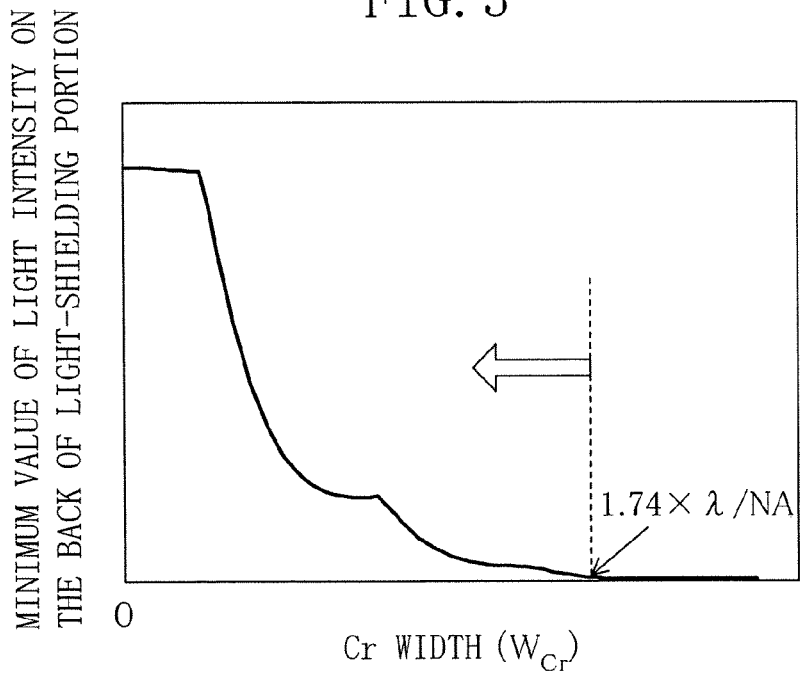
FIG. 3 is a diagram for showing the relationship, obtained by the present inventors through simulation, between the minimum value of light intensity on the back of the light-shielding portion and the width of the light-shielding portion in the photomask of the embodiment of the invention.

FIG. 3 shows the relationship between the minimum value of the light intensity on the back of a light-shielding portion and the Cr width $W_{Cr}$ obtained as a result of simulation performed by the present inventors. As shown in FIG. 3, when the Cr width $W_{Cr}$ is increased, the minimum value of the light intensity on the back of a light-shielding portion is reduced, and when the Cr width $W_{Cr}$ is larger than $1.74 \times \lambda/NA$, the minimum value of the light intensity on the back of a light-shielding portion is zero and a completely unexposed region is formed. Therefore, when the Cr width $W_{Cr}$ is smaller than $1.74 \times \lambda/NA$, the formation of a completely unexposed region can be prevented, so as to prevent the occurrence of a defect derived from an insoluble layer.

As described so far, when the Cr width $W_{Cr}$ of the light-shielding portion 15 provided around each second opening 13B of the photomask of this embodiment is not less than $0.12 \times \lambda/NA$ and not more than $1.74 \times \lambda/NA$, the occurrence of a side lobe can be prevented as well as the occurrence of a defect derived from an insoluble layer resulting from a completely unexposed region can be prevented.

Although the structure as shown in FIGS. 1B through 1D is exemplified as the structure of the photomask of this embodiment, the photomask of the invention is not limited to this structure. Similar effects can be attained by employing any of structures shown in FIGS. 4A and 4B and 7 through 9.

Figure 4A:
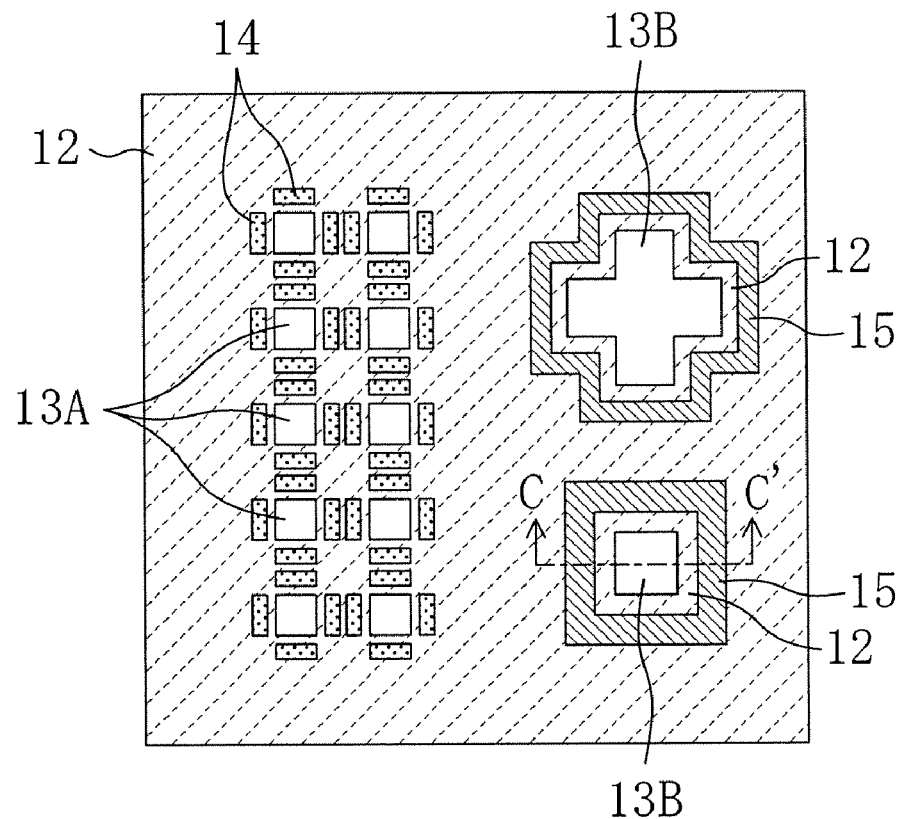
FIG. 4A is a plan view of another exemplified photomask according to the embodiment of the invention and FIG. 4B is a cross-sectional view taken on line C-C' of FIG. 4A.
Figure 4B:
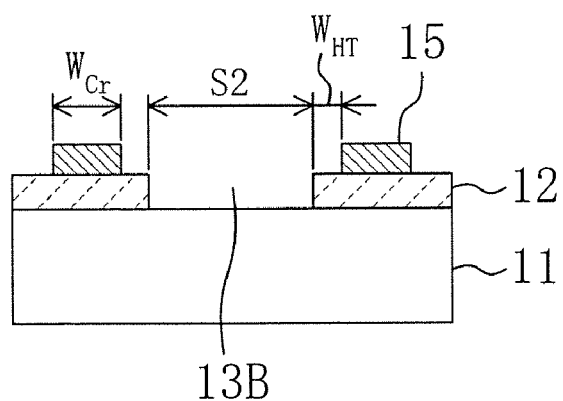

FIG. 4A is a plan view of another example of the photomask according to the embodiment of the invention, and specifically, another example of the enhancer mask used for forming the desired pattern 50 of FIG. 1A, and FIG. 4B is a cross-sectional view taken on line C-C' of FIG. 4A. In FIGS. 4A and 4B, like reference numerals are used to refer to like elements of the photomask of FIGS. 1B through 1D so as to avoid repetition of the description.

Also in the photomask of FIGS. 4A and 4B, a light-shielding portion 15 is provided on a transparent substrate 11 merely around each second opening 13B in the same manner as in the photomask of FIGS. 1B through 1D. However, a part (with an HT width $W_{HT}$) of the semi-light-shielding portion 12 is provided between the second opening 13B and the light-shielding portion 15 in the photomask of FIGS. 4A and 4B differently from the photomask of FIGS. 1B through 1D.

A material generally used for a light-shielding portion of a photomask, such as Cr, CrO or CrNO, has lower etching resistance against an acid as compared with a material used for a semi-light-shielding portion (such as MoSiO, MoSiNO, TaSiO, TaSiON, CrFO or CrFNO). Accordingly, in a mask cleaning process using an acid optimized for the semi-light-shielding portion, a pattern of the light-shielding portion easily shrinks. Therefore, in the case where a light-shielding portion withdraws from the edge of an opening, namely, when the HT width $W_{HT}$ is increased, light having the same phase as light passing through the opening passes through the semi-light-shielding portion disposed between the light-shielding portion and the opening. As a result, the dimension of a transferred pattern of the opening is larger than a desired dimension. The dimensional change of the transferred pattern of the opening per unit change of the HT width $W_{HT}$, namely, an MEEF (mask enhanced error factor) of the HT width $W_{HT}$ against the dimension of the transferred pattern of the opening, has a relatively small value when the HT width $W_{HT}$ is small and has a relatively large value as the HT width $W_{HT}$ increases. Therefore, the HT width $W_{HT}$ is preferably set in this embodiment so that dimensional change of a transferred pattern of an opening can be small (namely, so that the MEEF can be small) even when the HT width $W_{HT}$ is varied.

Figure 5:
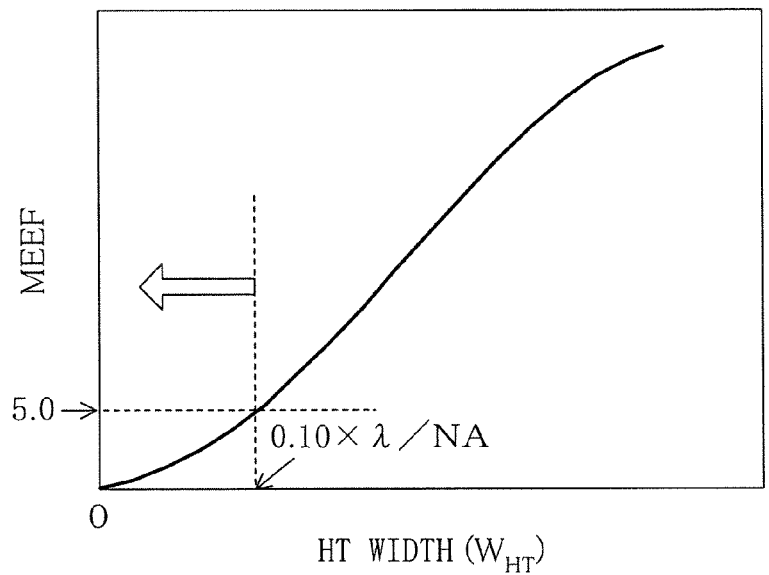
FIG. 5 is a diagram for showing the relationship, obtained by the present inventors through simulation, between the width of a part of a semi-light-shielding portion disposed between the light-shielding portion and an opening and MEEF in the photomask of the embodiment of the invention.

FIG. 5 shows the relationship between the HT width $W_{HT}$ and the MEEF obtained by the present inventors through simulation. As shown in FIG. 5, as the HT width $W_{HT}$ is increased from 0, the MEEF is increased. In order to meet the condition that the MEEF is not more than 5.0, the HT width $W_{HT}$ has to be not more than $0.10 \times \lambda/NA$. The reason why the MEEF is set to be not more than 5.0 is that, for example, when the dimension of a transfer pattern required for forming an LSI of 45 nm rule is not more than ±10% (i.e., not more than ±7 nm) of an intended dimension of 70 nm and when the mask formation accuracy on a wafer is 1.0 nm (4.0 nm on the mask), it is supposed to be necessary to set the MEEF to be not more than 5.0 in consideration of variations in a transfer process. Depending on the dimension, the mask formation accuracy, the variations in a transfer process or the like, the MEEF may be reduced to a further extent. In such a case, the HT width $W_{HT}$ has to be reduced to a further extent.

On the other hand, when the HT width $W_{HT}$ is large, there arises a problem of the occurrence of a side lobe. As described above, a side lobe is caused due to a secondary peak of the light intensity derived from diffraction of light caused at the edge of an opening, and therefore, it is caused in a position away from the edge of the opening by a distance defined by the numerical aperture NA and the wavelength $\lambda$. Accordingly, when the HT width $W_{HT}$ is not more than a given value, the position of a secondary peak can be shielded by a light-shielding portion, and hence, the occurrence of a side lobe can be prevented.

Figure 6:
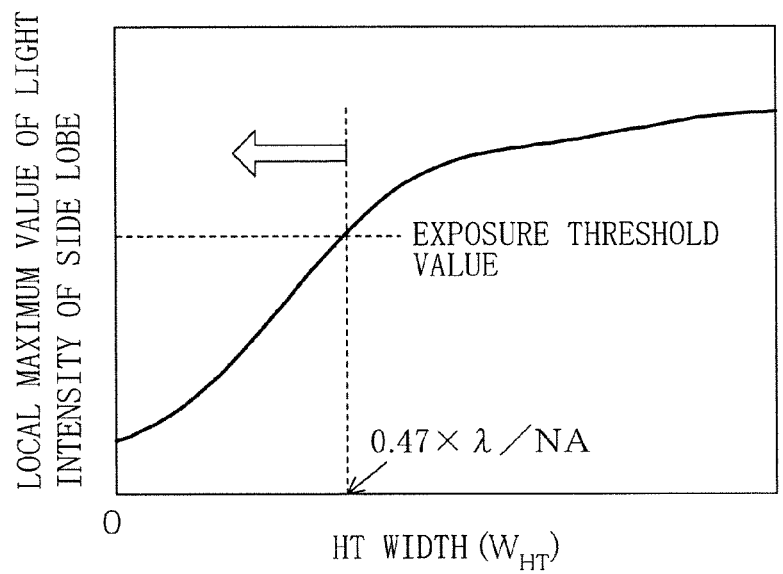
FIG. 6 is a diagram for showing the relationship, obtained by the present inventors through simulation, between the width of the part of the semi-light-shielding portion disposed between the light-shielding portion and the opening and the local maximum value of the light intensity of the side lobe in the photomask of the embodiment of the invention.

FIG. 6 shows the relationship between the HT width $W_{HT}$ and the local maximum value Imax of the light intensity of a side lobe obtained by the present inventors through simulation. As shown in FIG. 6, as the HT width $W_{HT}$ is increased, the Imax value of a side lobe is increased, and when the HT width $W_{HT}$ exceeds $0.47 \times \lambda/NA$, the Imax value exceeds the exposure threshold value. In other words, when the HT width $W_{HT}$ is set to be not more than $0.47 \times \lambda/NA$, the occurrence of a side lobe can be prevented.

The results shown in FIGS. 5 and 6 indicate that it is preferable to set the HT width $W_{HT}$ of the part of the semi-light-shielding portion 12 disposed between each second opening 13B and the light-shielding portion 15 to be not more than $0.10 \times \lambda/NA$. However, this holds true only when the MEEF is set to be not more than 5.0. That is, it is necessary to calculate the HT width $W_{HT}$ based on the MEEF value which is a minimum requirement for providing the accessory pattern in the enhancer mask. If the thus-calculated value exceeds $0.47 \times \lambda/NA$, the HT width $W_{HT}$ is preferably set to be not more than $0.47 \times \lambda/NA$.

As described so far, in the case where the photomask shown in FIGS. 4A and 4B simultaneously includes first openings 13A each having a first dimension S1 not more than $0.5 \times \lambda/NA$ and second openings 13B each having a second dimension S2 larger than $0.5 \times \lambda/NA$, the HT width $W_{HT}$ of the part of the semi-light-shielding portion 12 disposed between each second opening 13B and the light-shielding portion 15 is set to be not more than $0.10 \times \lambda/NA$ and the Cr width $W_{Cr}$ of the light-shielding portion 15 is set to be not less than $0.12 \times \lambda/NA$ and not more than $1.74 \times \lambda/NA$ as described above. In this manner, while suppressing the MEEF of the HT width $W_{HT}$, the occurrence of a side lobe is prevented as well as the occurrence of a defect derived from an insoluble layer resulting from a completely unexposed region can be prevented.

Figure 7:
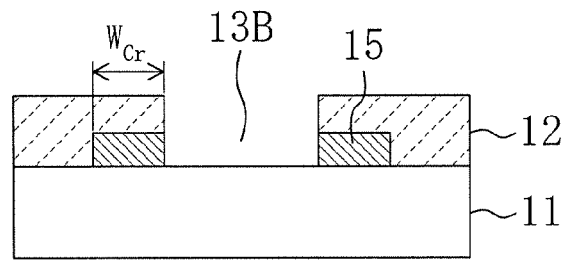
FIG. 7 is a cross-sectional view for showing a variation of the photomask according to the embodiment of the invention.

FIG. 7 is a cross-sectional view for showing another example of the photomask according to the embodiment of the invention, and specifically shows an exemplified variation of the cross-sectional structure shown in FIG. 1D, that is, a cross-sectional view taken on line B-B' of FIG. 1B crossing the second opening 13B. Specifically, in the photomask of FIG. 7, a light-shielding portion 15 is provided to be in contact with a second opening 13B. Although the light-shielding portion 15 is formed on the semi-light-shielding portion 12 to be disposed around each second opening 13B in the photomask shown in FIGS. 1B through 1D, the light-shielding portion 15 is formed directly on a portion of a transparent substrate 11 disposed around the second opening 13B, and a semi-light-shielding portion 12 is formed so as to cover the light-shielding portion 15 and surround the second opening 13B in the photomask of FIG. 7.

In employing the photomask structure shown in FIG. 7, even when a first opening 13A with a first dimension S1 not more than $0.5 \times \lambda/NA$ and a second opening 13B with a second dimension S2 larger than $0.5 \times \lambda/NA$ are simultaneously present, the occurrence of a side lobe can be prevented as well as the occurrence of a defect derived from an insoluble layer resulting from a completely unexposed region can be prevented by setting the Cr width $W_{Cr}$ of the light-shielding portion 15 in the same manner as in the photomask shown in FIGS. 1B through 1D.

Figure 8:
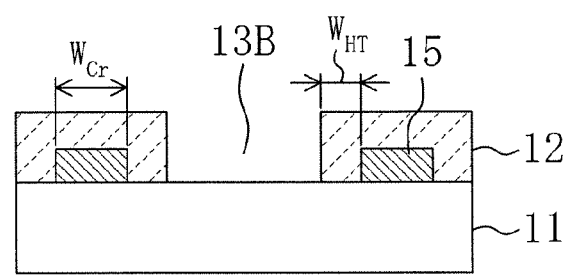
FIG. 8 is a cross-sectional view for showing another variation of the photomask according to the embodiment of the invention.

FIG. 8 is a cross-sectional view for showing still another example of the photomask according to the embodiment of the invention, and specifically shows an exemplified variation of the cross-sectional structure shown in FIG. 4B, that is, a cross-sectional view taken on line C-C' of FIG. 4A crossing the second opening 13B. Specifically, in the photomask of FIG. 8, a part (with an HT width $W_{HT}$) of a semi-light-shielding portion 12 is disposed between a second opening 13B and a light-shielding portion 15. Although the light-shielding portion 15 is formed on the semi-light-shielding portion 12 to be disposed around each second opening 13B in the photomask shown in FIGS. 4A and 4B, the light-shielding portion 15 is formed directly on a portion of a transparent substrate 11 disposed around the second opening 13B, and the semi-light-shielding portion 12 is formed so as to cover the light-shielding portion 15 and surround the second opening 13B in the photomask of FIG. 8.

In employing the photomask structure shown in FIG. 8, even when a first opening 13A with a first dimension S1 not more than $0.5 \times \lambda/NA$ and a second opening 13B with a second dimension S2 larger than $0.5 \times \lambda/NA$ are simultaneously present, the occurrence of a side lobe can be prevented as well as the occurrence of a defect derived from an insoluble layer resulting from a completely unexposed region can be prevented while suppressing the MEEF of the HT width $W_{HT}$ by setting the Cr width $W_{Cr}$ of the light-shielding portion 15 and the HT width $W_{HT}$ of the semi-light-shielding portion 12 in the same manner as in the photomask shown in FIGS. 4A and 4B.

Figure 9:
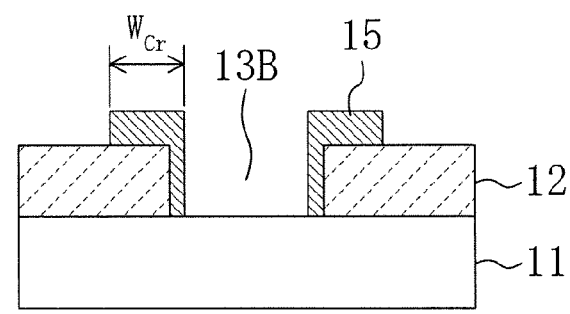
FIG. 9 is a cross-sectional view for showing still another variation of the photomask according to the embodiment of the invention.

FIG. 9 is a cross-sectional view for showing still another example of the photomask according to the embodiment of the invention, and specifically shows an exemplified variation of the cross-sectional structure shown in FIG. 1D, that is, a cross-sectional view taken on line B-B' of FIG. 1B crossing the second opening 13B. Specifically, in the photomask of FIG. 9, a light-shielding portion 15 is provided so as to be in contact with the second opening 13B. Although the side faces of the semi-light-shielding portion 12 and the light-shielding portion 15 disposed on the side of the second opening 13B are continuously formed at the same level in the photomask shown in FIGS. 1B through 1D, the light-shielding portion 15 is formed on a semi-light-shielding portion 12 surrounding the second opening 13B so as to cover the side face of the semi-light-shielding portion 12 disposed on the side of the second opening 13B in the photomask of FIG. 9. In the photomask of FIG. 9, the Cr width $W_{Cr}$ of the light-shielding portion 15 is defined as a distance from an edge of the light-shielding portion 15 on the side of the second opening 13B to an opposite edge of the light-shielding portion 15. Furthermore, in the photomask of FIG. 9, a second dimension S2 of the second opening 13B is defined as a distance between the edges of the light-shielding portion 15.

In employing the photomask structure shown in FIG. 9, even when a first opening 13A with a first dimension S1 not more than $0.5\times\lambda/NA$ and a second opening 13B with a second dimension S2 larger than $0.5\times\lambda/NA$ are simultaneously present, the occurrence of a side lobe can be prevented as well as the occurrence of a defect derived from an insoluble layer resulting from a completely unexposed region can be prevented by setting the Cr width $W_{Cr}$ of the light-shielding portion 15 in the same manner as in the photomask shown in FIGS. 1B through 1D.

Although the light-shielding portion 15 is provided around each second opening 13B so as to completely surround the second opening 13B in all the aforementioned exemplified structures of the photomask of this embodiment, the light-shielding portion 15 need not completely surround the second opening 13B. For example, even when the light-shielding portion 15 is provided at least in a region where a side lobe may occur (namely, in the position of a secondary peak on a photomask) as shown in plan views of FIGS. 10A through 10D (each of which shows the plane structure of and around the second opening 13B), similar effects as those attained by any of the aforementioned photomask structures can be attained. Moreover, when the light-shielding portion 15 is disconnected at the corners of the second opening 13B as shown in FIGS. 10A through 10D, a pattern with a high rectangular property can be advantageously obtained. Specifically, since the semi-light-shielding portion 12 is present instead of the light-shielding portion 15 around the corners of the second opening 13B, a larger amount of light passes through around the corners of the second opening 13B, resulting in improving the transfer accuracy of the rectangular second opening 13B, namely, the rectangular property of the transferred pattern.

Figure 10A:
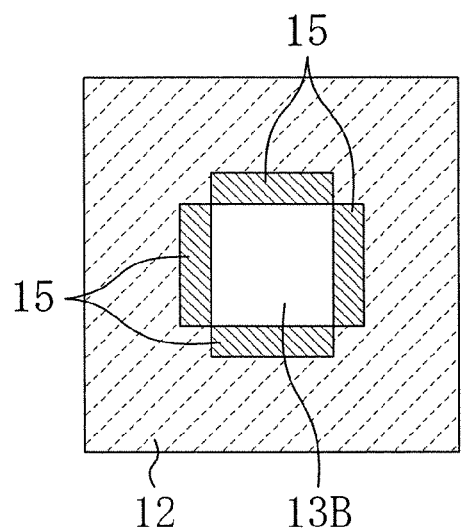
FIGS. 10A to 10D are plan views for showing variations of the photomask according to the embodiment of the invention.

Specifically, in the photomask of FIG. 10A, each of disconnected parts of a light-shielding portion 15 has the same length as a corresponding side of a second opening 13B in a rectangular shape and is in contact with the corresponding side.

Figure 10B:
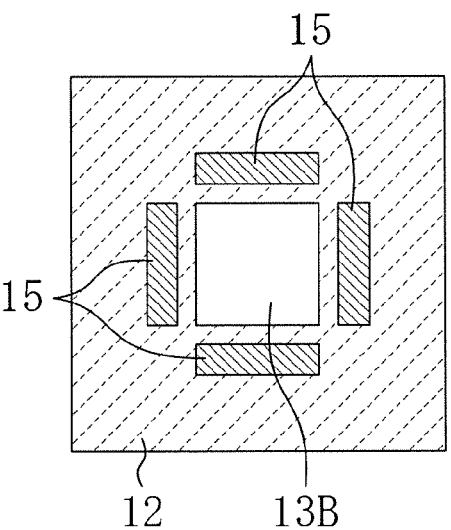

In the photomask of FIG. 10B, each of disconnected parts of a light-shielding portion 15 has the same length as a corresponding side of a second opening 13B in a rectangular shape and a part of a semi-light-shielding portion 12 is present between each disconnected part of the light-shielding portion 15 and the second opening 13B.

Figure 10C:
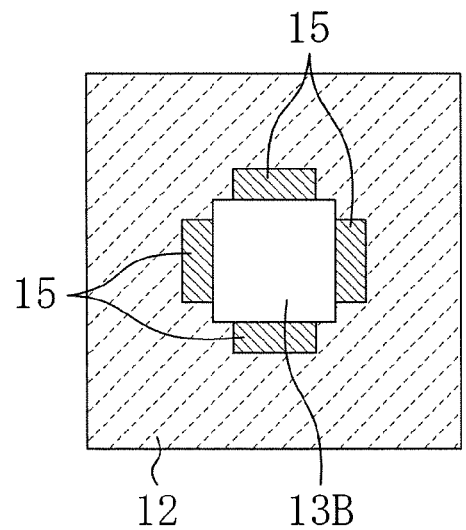

In the photomask of FIG. 10C, each of disconnected parts of a light-shielding portion 15 has a length shorter than a corresponding side of a second opening 13B in a rectangular shape and is in contact with the corresponding side.

Figure 10D:
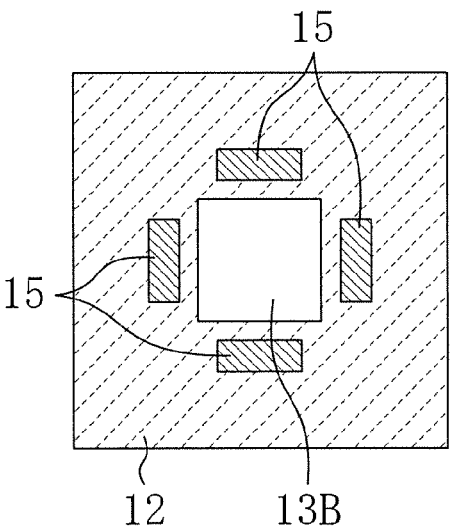

In the photomask of FIG. 10D, each of disconnected parts of a light-shielding portion 15 has a length shorter than a corresponding side of a second opening 13B in a rectangular shape and a part of a semi-light-shielding portion 12 is present between each disconnected part of the light-shielding portion 15 and the second opening 13B.

So far, in the photomask structure of the present embodiment, the phase-shifting portion 14 provided around the first opening 13A is disconnected at the corners of the first opening 13A. Specifically, each disconnected part of the phase-shifting portion 14 has the same length as the length of a corresponding side of the square-shaped first opening 13A and a part of the semi-light-shielding portion 12 is present between the disconnected part of the phase-shifting portion 14 and the first opening 13A. This structure achieves the highest optical contrast determined by optical conditions. However, the arrangement of the phase-shifting portion 14 is not limited thereto. For example, each disconnected part of the phase-shifting portion 14 may have a length different from the length of a corresponding side of the rectangular-shaped first opening 13A, or the phase-shifting portion 14 may surround the first opening 13A without being disconnected at the corners of the first opening 13A. Alternatively, the part of the semi-light-shielding portion 12 may not be present between the phase-shifting portion 14 and the first opening 13A.

Now, a pattern formation method using the photomask of this embodiment will be described with reference to the accompanying drawings.

Figure 11A:
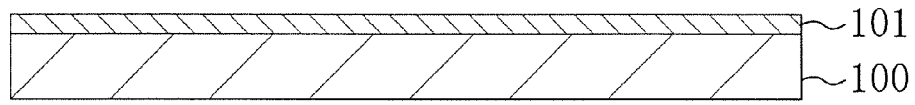
FIGS. 11A to 11D are cross-sectional views for showing procedures in a pattern formation method using the photomask according to the embodiment of the invention.
Figure 11B:
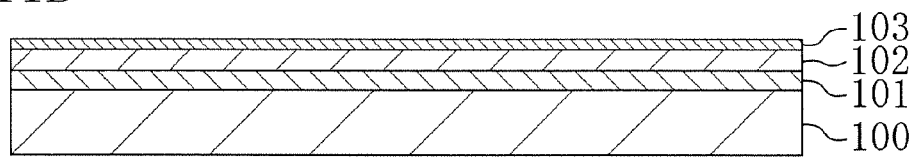
Figure 11C:
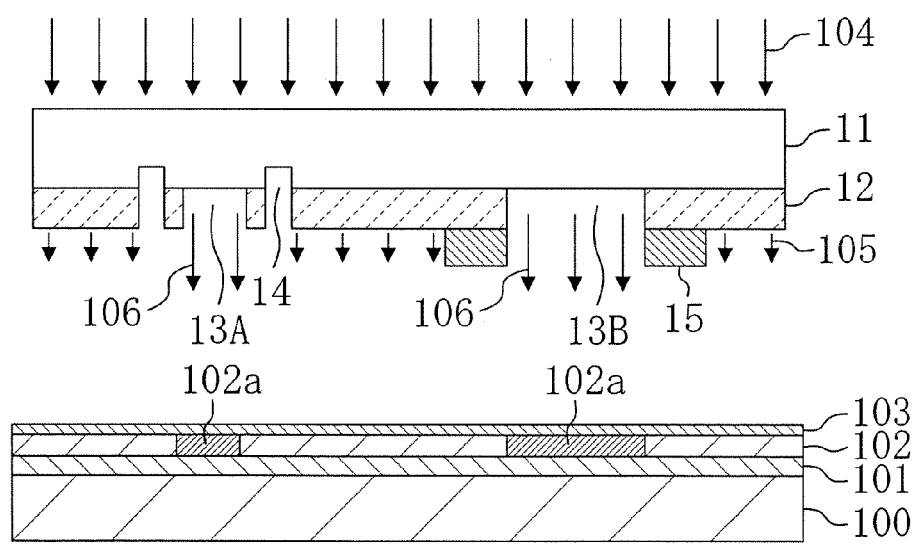

FIGS. 11A through 11D are cross-sectional views for showing procedures in the pattern formation method using the photomask of this embodiment. In FIG. 11C, like reference numerals are used to refer to like elements included in the photomask shown in FIGS. 1B through 1D so as to avoid repetition of the description.

First, as shown in FIG. 11A, a target film 101 of a metal film, an insulating film or the like is formed on a substrate 100, and thereafter, a positive resist film 102 is formed on the target film 101 as shown in FIG. 11B. At this point, when the immersion exposure is employed, a top coat 103 is further formed on the resist film 102 so as to coat the resist film 102.

Next, as shown in FIG. 11C, a photomask of this embodiment having a structure shown in, for example, FIGS. 1B through 1D, is irradiated with exposing light 104 using a light source of, for example, ArF excimer laser. At this point, the resist film 102 is exposed by transmitted light 106 having passed through a first opening 13A and a second opening 13B of the photomask of this embodiment, resulting in forming latent portions 102a corresponding to the openings 13A and 13B. It is merely the latent portions 102a that are irradiated with exposure energy sufficient for completely dissolving the resist in development subsequently performed. On the other hand, transmitted light 105 having passed though a semi-light-shielding portion 12 (namely, a portion where no light-shielding portion 15 is formed) of the photomask of this embodiment is in an identical phase to the transmitted light 106 but does not have sufficient energy for forming a latent portion.

When the Cr width $W_{Cr}$ of the light-shielding portion 15 provided around each second opening 13B in the photomask of this embodiment is set to be not less than $0.12\times\lambda/NA$ and not more than $1.74\times\lambda/NA$ as described above, there is no completely shielded region (completely unexposed region) with light intensity of 0 not only on the back of the semi-light-shielding portion 12 but also on the back of the light-shielding portion 15, but these backs are also irradiated with light with intensity lower than an exposure threshold value. Accordingly, even when the top coat 103 is formed, adhesion between an insoluble layer, formed on a contact face between the resist film 102 and the top coat 103, and the resist film 102 is low, and hence, the occurrence of a resist defect derived from an insoluble layer can be prevented.

Figure 11D:
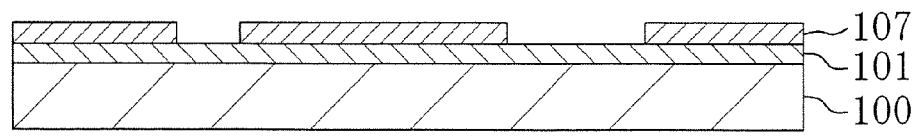

Next, the development is performed on the top coat 103 and the resist film 102 so as to remove the top coat 103 and the latent portions 102a of the resist film 102, resulting in forming a resist pattern 107 as shown in FIG. 11D.

Figure 12:
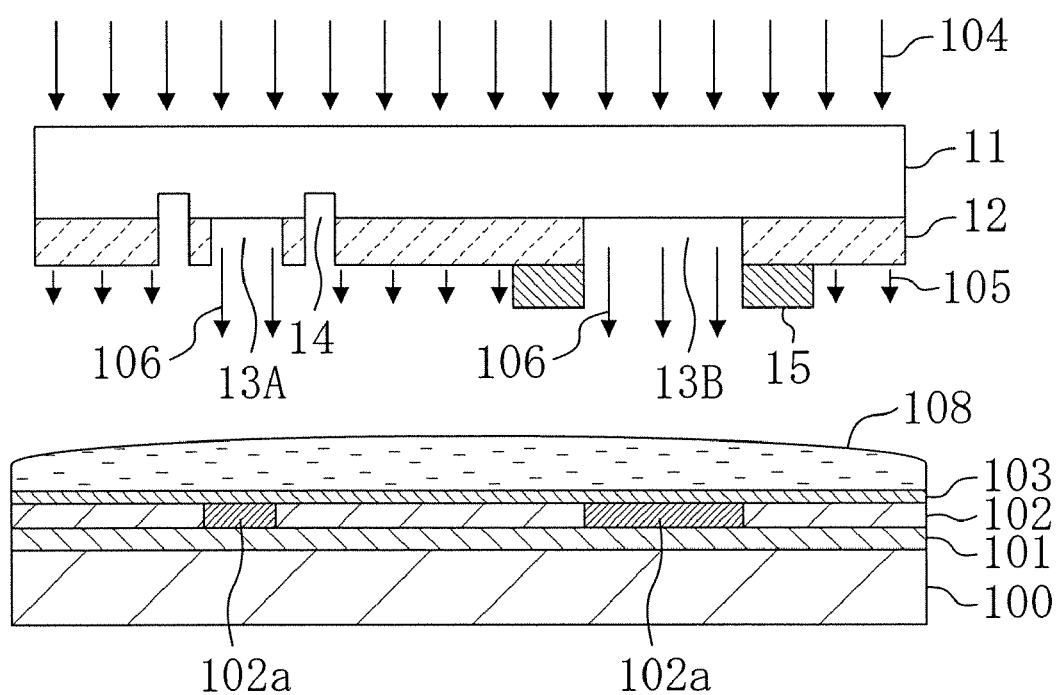
FIG. 12 is a cross-sectional view for explaining one procedure in a pattern formation method (employing immersion exposure process) using the photomask according to the embodiment of the invention.
Figure 13A:
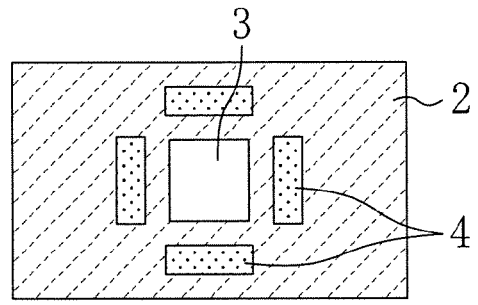
FIG. 13A is a plane view for showing an enhancer mask having a relatively small opening.
Figure 13B:
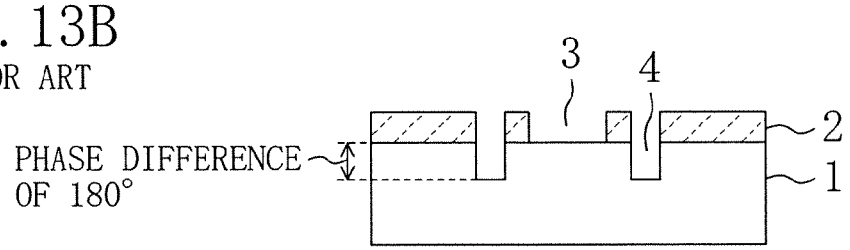
FIG. 13B is a cross-sectional view of the enhancer mask of FIG. 13A.
Figure 13C:
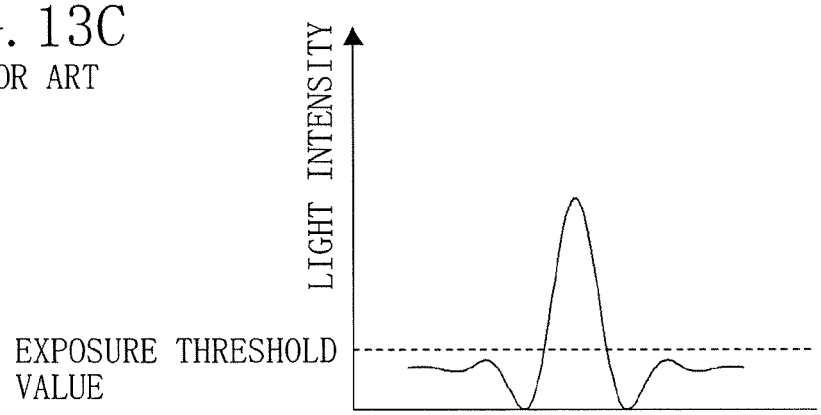
FIG. 13C is a diagram of a light intensity profile obtained in using the enhancer mask of FIGS. 13A and 13B and FIG. 13D is a schematic plan view of a pattern transferred onto a wafer when the opening of FIGS. 13A and 13B is a hole pattern.
Figure 13D:
Figure 14A:
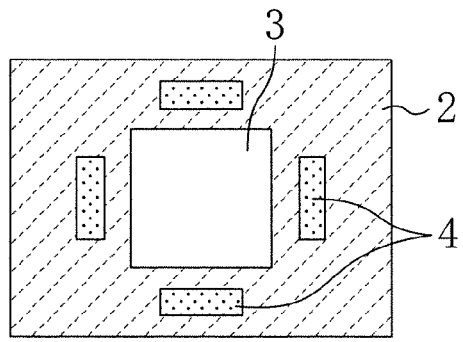
FIG. 14A is a plane view for showing an enhancer mask having a relatively large opening.
Figure 14B:
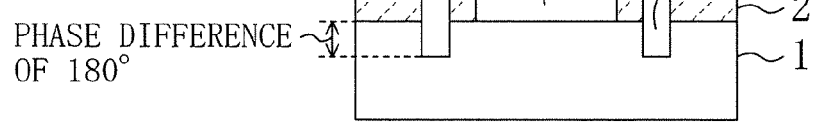
FIG. 14B is a cross-sectional view of the enhancer mask of FIG. 14A.
Figure 14C:
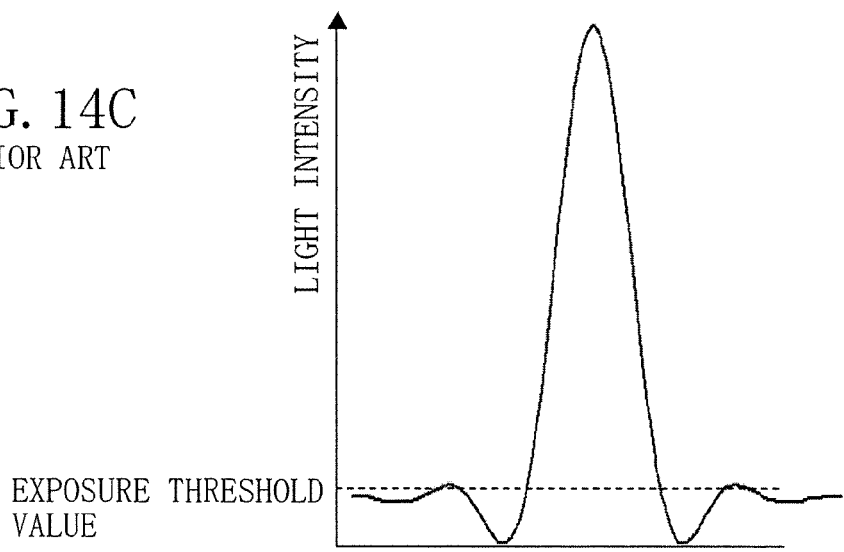
FIG. 14C is a diagram of a light intensity profile obtained in using the enhancer mask of FIGS. 14A and 14B and FIG. 14D a schematic plan view of a pattern transferred onto a wafer when the opening of FIGS. 14A and 14B is a hole pattern.
Figure 14D:
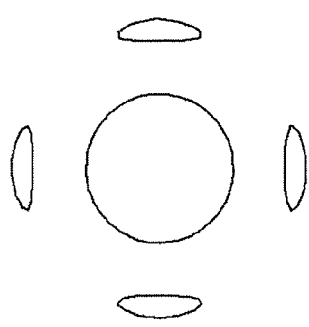
Figure 15:
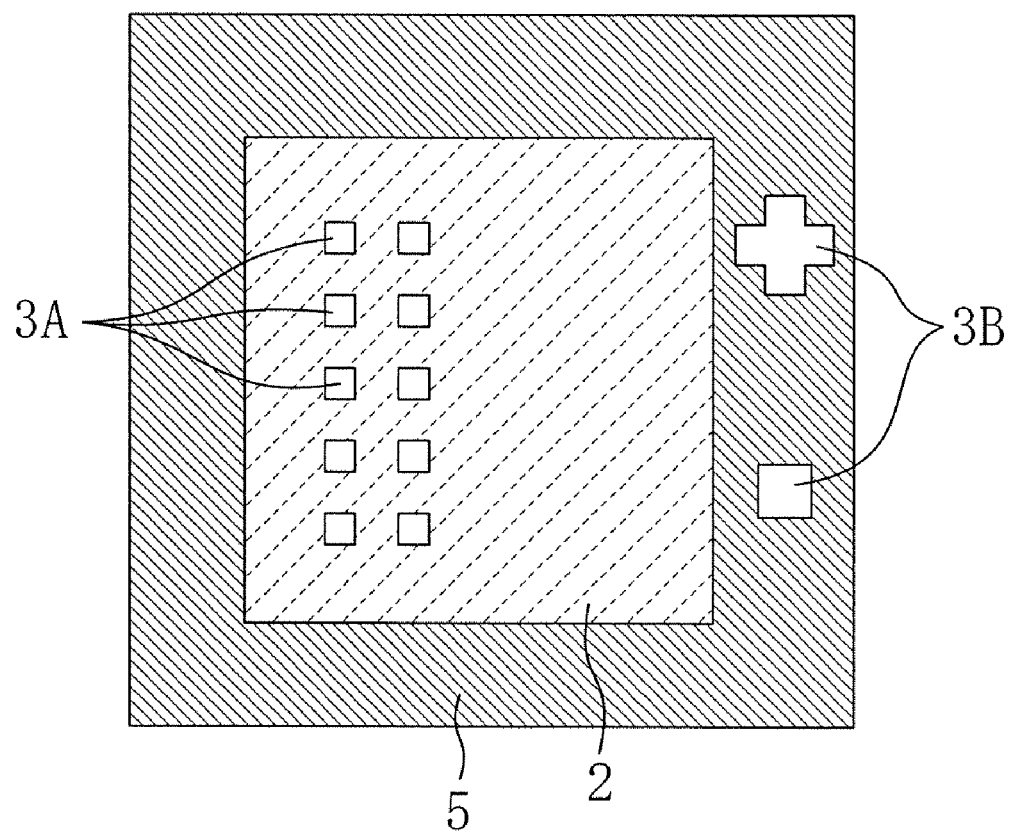
FIG. 15 is a plan view of a conventional photomask disclosed in Patent Document 1.

FIG. 12 is a diagram for showing a procedure corresponding to that shown in FIG. 11C performed when the immersion exposure process is employed. In the case where the immersion exposure process is employed, a similar procedure to that of FIG. 11C is carried out except that the exposure is performed with an immersion liquid 108 present on the top coat 103 as shown in FIG. 12.

As described so far, according to the present embodiment, even when an enhancer mask capable of simultaneously forming a fine isolated contact pattern and densely arranged contact patterns is provided with a large opening such as an accessory pattern or other patterns, and particularly when the enhancer mask is used with immersion exposure process or the like process in which a chemically amplified resist and a top coat are used in combination, the occurrence of a side lobe and the occurrence of a defect can be simultaneously prevented, so that a fine LSI can be fabricated.

What is claimed is:

1. A photomask comprising:
    a transparent substrate having a transparent property against exposing light,
    a semi-light-shielding portion formed on the transparent substrate;
    an opening formed in the semi-light-shielding portion; and
    a light-shielding portion formed on the transparent substrate and surrounding the opening, wherein:
    the semi-light-shielding portion transmits the exposing light in an identical phase with respect to the opening, and
    the light-shielding portion has a width not more than a maximum width with which an unexposed region is not formed by the exposing light having passed through the opening and diffracting at an edge of the opening to round to a back of the light-shielding portion.

2. The photomask of claim 1, wherein the light-shielding portion is disconnected at a corner of the opening.

3. The photomask of claim 2, wherein each disconnected part of the light-shielding portion has a length shorter than a corresponding side of the opening.

4. The photomask of claim 1, wherein the light-shielding portion has a width not less than a minimum width with which light intensity of a side lobe caused by diffraction, at an edge of the opening, of the exposing light having passed through the opening is not sufficient for sensitizing a resist.

5. The photomask of claim 1, wherein:
    the photomask is designed for a specific reduction projection optical system, and is included in such a system along with an exposure apparatus, and
    the light-shielding portion of the photomask has a width not less than $(0.12 \times \lambda/NA) \times M$, where $\lambda$ is a wavelength of the exposing light, NA is numerical aperture of a reduction projection optical system of an aligner and M is a reduction ratio of the reduction projection optical system.

6. The photomask of claim 1, wherein:
    the photomask is designed for a specific reduction projection optical system, and is included in such a system along with an exposure apparatus, and
    the light-shielding portion of the photomask has a width not more than $(1.74 \times \lambda/NA) \times M$, where $\lambda$ is a wavelength of the exposing light, NA is numerical aperture of a reduction projection optical system of an aligner and M is a reduction ratio of the reduction projection optical system.

7. The photomask of claim 1, wherein the light-shielding portion is in contact with the opening.

8. The photomask of claim 1, wherein a part of the semi-light-shielding portion is present between the opening and the light-shielding portion.

9. The photomask of claim 8, wherein:
    the photomask is designed for a specific reduction projection optical system, and is included in such a system along with an exposure apparatus, and
    the part of the semi-light-shielding portion of the photomask present between the opening and the light-shielding portion has a width not more than $(0.10 \times \lambda/NA) \times M$, where $\lambda$ is a wavelength of the exposing light, NA is numerical aperture of a reduction projection optical system of an aligner and M is a reduction ratio of the reduction projection optical system.

10. A pattern formation method using the photomask of claim 1, the method comprising steps of:
    (a) forming a resist film on a substrate;
    (b) irradiating the resist film with the exposing light through the photomask; and
    (c) patterning the resist film by developing the resist film having been irradiated with the exposing light.

11. The pattern formation method of claim 10, wherein an ArF excimer laser is used as an exposing light source in the step (b).

12. The pattern formation method of claim 11, wherein an immersion exposure process is employed in the step (b).

13. The pattern formation method of claim 12, wherein the step (a) includes coating of the resist film with a top coat.

* * * * *